(12) United States Patent
Boyan et al.

(10) Patent No.: US 6,389,365 B1
(45) Date of Patent: May 14, 2002

(54) METHOD FOR OPERATING A SPECTRUM ANALYZER TO DISPLAY A MARKER OF A SIGNAL OF INTEREST

(75) Inventors: Corydon J. Boyan; Tosya Shore, both of Santa Rosa; David Del Castillo, Winsor, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/383,065

(22) Filed: Aug. 25, 1999

(51) Int. Cl.$^7$ ............................................... G01R 23/16
(52) U.S. Cl. .................. 702/76; 702/75; 324/76.19; 324/76.23
(58) Field of Search ................................ 702/68.75, 76, 702/191; 345/771; 324/76.23, 76.19, 76.37; 73/659

(56) References Cited

U.S. PATENT DOCUMENTS

| | | | | |
|---|---|---|---|---|
| 4,660,150 A | * | 4/1987 | Anderson et al. | 702/68 |
| 5,210,483 A | * | 5/1993 | Amamoto et al. | 324/76.27 |
| 5,550,747 A | * | 8/1996 | Newman, Jr. | 702/68 |

FOREIGN PATENT DOCUMENTS

| | | | |
|---|---|---|---|
| GB | 2158594 | 11/1985 | G01R/23/16 |
| GB | 2158595 | 11/1985 | G01R/23/16 |

\* cited by examiner

Primary Examiner—Kamini Shah

(57) ABSTRACT

A method for operating a spectrum analyzer to provide a marker that follows a peak from sweep to sweep in a spectrum display. The method operates on first and second measured spectrums. The first measured spectrum includes a plot of the signal amplitude against frequency during a first time interval in which the marker has been assigned to a peak at a first frequency and first amplitude. The present invention assigns the marker to a peak in the second spectrum measured during a subsequent time interval in which the marker is to be assigned. Initially, a first frequency range is defined in the second measured spectrum centered on the first frequency. The first frequency range is searched for candidate peaks having amplitudes within a first range centered on the first amplitude. If more than one such candidate peak is found by the search, the marker is assigned to the candidate peak closest to the first frequency. If a candidate peak is not found, a second frequency range is defined centered on the first frequency, and the process is repeated with a different amplitude range. If more than one such candidate peak is found by the search, the marker is assigned to the candidate peak farthest from the first frequency. If no candidate peak is found, a third frequency range in the second measured spectrum is defined and this frequency range is searched for all candidate peaks regardless of amplitude. The marker is assigned to one of the candidate peaks based on a weighted sum of the differences in amplitude and frequency of the candidate peaks and the first amplitude and frequency.

4 Claims, 1 Drawing Sheet

METHOD FOR OPERATING A SPECTRUM ANALYZER TO DISPLAY A MARKER OF A SIGNAL OF INTEREST

FIELD OF THE INVENTION

The present invention relates to display systems, and more particularly, to a method for providing a marker on a peak of interest in a signal display such as that provided with spectrum analyzers and the like.

BACKGROUND OF THE INVENTION

Spectrum analyzers provide a display which tracks the amplitude versus frequency of the various frequency components of a signal input thereto. The displayed portion of the signal spectrum typically includes a number of peaks corresponding to different signal frequencies. The peaks often move over time and change amplitude. In many cases, the spectrum analyzer user needs to follow one of these peaks as it moves back and forth on the display screen (i.e. changes frequency) without otherwise altering the display. Prior art display systems for spectrum analyzers do not provide this functionality.

Broadly, it is the object of the present invention to provide an improved display system for a spectrum analyzer.

It is a further object of the present invention to provide a marker that appears on the display screen at the location of a peak of interest and moves with that peak.

These and other objects of the present invention will become apparent to those skilled in the art from the following detailed description of the invention and the accompanying drawings.

SUMMARY OF THE INVENTION

The present invention is a method for operating a spectrum analyzer to provide a marker that follows a peak from sweep to sweep in a spectrum display. The spectrum display includes a graph of the amplitude of a signal plotted against frequency. The present invention operates on first and second measured spectrums. The first measured spectrum includes a plot of the signal amplitude against frequency during a first time interval in which the marker has been assigned a first frequency and first amplitude corresponding to the peak of interest. The second spectrum includes a plot of the signal amplitude against frequency during a subsequent time interval in which the marker is to be assigned a new frequency and amplitude location. The present invention begins by defining a first frequency range in the second measured spectrum centered around the first frequency. The first frequency range is searched for a candidate peak having an amplitude within a first range centered on the first amplitude. If such a candidate peak is found, the marker location is assigned to the frequency of the candidate peak in the second spectrum and the amplitude of the marker to the amplitude of the candidate peak in the second spectrum. If more than one such candidate peak is found by the search, the frequency and amplitude of the candidate peak closest to the first frequency are assigned as the marker location. If a candidate peak is not found, a second frequency range is defined in the second measured spectrum centered around the first frequency. The second frequency range is then searched for a candidate peak having an amplitude within a second range centered on the first amplitude. If such a candidate peak is found, the marker location is assigned to the frequency of the candidate peak in the second spectrum and the amplitude of the marker to the amplitude of the candidate peak in the second spectrum. If more than one such candidate peak is found by the search, the frequency and amplitude of the candidate peak farthest from the first frequency are assigned as the marker location. If no candidate peak is found, a third frequency range in the second measured spectrum is defined and this frequency range is searched for candidate peaks. The third frequency range preferably includes the entire measured frequency range. The candidate peaks found are assigned an order value based on the differences in frequency and amplitude between each candidate peak and the first frequency and the first amplitude, respectively. The marker location is assigned to the frequency and amplitude of the candidate peak having the highest order value. The order value preferably depends on a weighted sum of difference in frequency and the difference in amplitude.

DETAILED DESCRIPTION OF THE INVENTION

Figure 1:
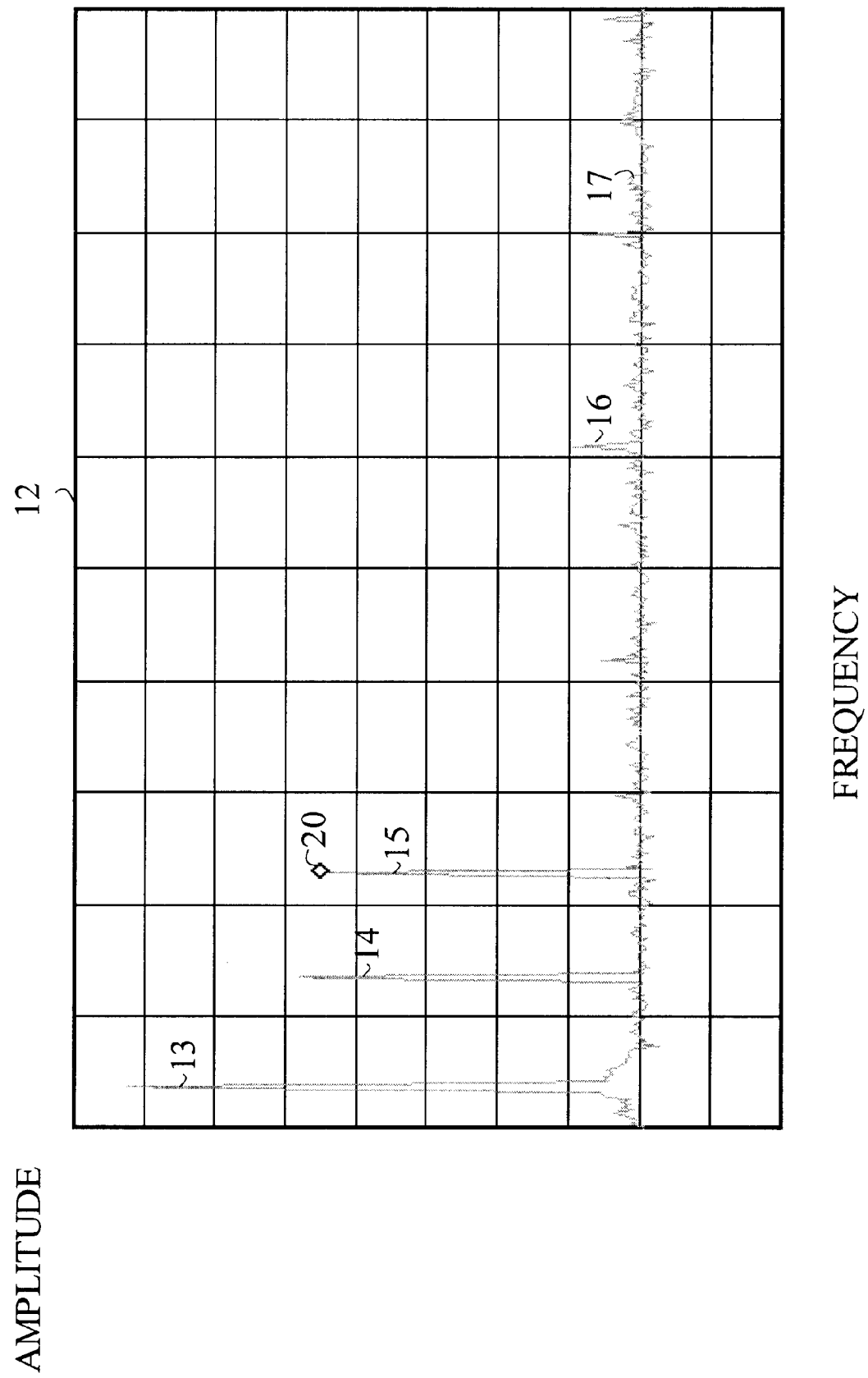
FIG. 1 illustrates a display screen from a spectrum analyzer according to the present invention.

The manner in which the present invention achieves its advantages may be more easily understood with reference to FIG. 1, which illustrates a display screen from a spectrum analyzer according to the present invention. In essence, in each sweep, the analyzer measures the amplitude as a function of time of an input signal over a small time interval and computes the frequency content of the signal in the form of a plot 12 of the amplitude as a function of frequency. The spectrum typically includes a number of peaks that are observed to move between sweeps. Exemplary peaks are shown at 13–16. In addition, the spectrum typically includes a large number of noise peaks such as peak 16 that move rapidly both in location and amplitude from sweep to sweep. The present invention provides a marker, shown at 20, that follows a peak identified by the user. The user can identify the peak by moving a cursor to the peak. Alternatively, the controller can search for the peak in the vicinity of the cursor using one of the algorithms discussed below. Once the analyzer has acquired the peak of interest, the analyzer automatically follows that peak and moves the marker to stay at the peak location until the user alters the display mode or the peak is lost.

For many signals of interest, the time intervals are relatively small, typically a few milliseconds. Any computations must be performed in a time that is less than the sweep time so that the processor in the analyzer can keep up with the incoming data. Accordingly, the following algorithm must be computationally efficient.

Having provided the above overview of the functionality implemented by the present invention, the manner in which the analyzer computes the current location of the peak will now be discussed in more detail. For the purposes of this discussion, it will be assumed that the user has indicated the peak of interest. The frequency at which that peak appeared in the last sweep is denoted by F, and the amplitude of the peak in the last sweep is denoted by A.

The present invention utilizes a series of three algorithms to follow the peak. The first algorithm is a fast algorithm that will quickly find the peak if the peak has not changed in frequency by a large amount from the previous sweep. If this algorithm fails to find the peak, a second algorithm that searches for a peak in a predetermined range around the previous value is utilized. If the second algorithm fails an exhaustive search is made of the entire frequency range currently being displayed and the peak to be marked is selected from the peaks found in that range based on an error criterion.

The analyzer defines a sequence of three (frequency, amplitude) measurements to be a peak of interest at the frequency of the second measurement if the amplitude of the second measurement exceeds that of the first and third measurements by a predetermined amount. In addition, the amplitude of the second measurement must be greater than a predetermined threshold. The threshold requirement prevents noise peaks from being identified as peaks of interest. A set of three measurement points on the display will be said to satisfy the peak criterion if these two conditions are met.

As noted above, the present invention first attempts to find the peak in the new scan by examining a region around F for a peak that is likely to be the peak of interest. It is assumed that the amplitude of peak has not changed by more than a predetermined amount from that observed in the last sweep. The (frequency, amplitude) data displayed on the screen is digitized. That is, the display is a set of points $(f_j, A_j)$ for j=1 to N. The j value for the previous peak position will be denoted by J. This algorithm tests each triplet $(f_{j-1}, A_{j-1})$, $(f_j, A_j)$, and $(f_{j+1}, A_{j+1})$ for $j=j-dJ_1$ to $j=j+dJ_1$ to determine if the triplet satisfies the peak condition. Here, $dJ_1$ is an integer defining the width of the search window. The triplets are tested in order based on their distance from J. That is, the triplet centered at j is tested, then the triplet at J+1, next the triplet at J−1, next the triplet at J+2, and so on. If a peak is found, the amplitude is compared to the previous amplitude for the marked peak. If $A - dA_1 \leq A_j \leq A + dA_1$ the peak is assumed to be the peak corresponding to the marked peak in the previous display, and the process is terminated. Here, dA, is a predetermined tolerance constant which defines the maximum acceptable rate of change for the peak amplitude between frames. If the peak amplitude lies outside this range, the peak is rejected and the search continues. If no peak is found within the frequency range defined by $dJ_1$, the controller continues the search using the second search algorithm.

The second search algorithm is similar to the first search algorithm in that the controller on the analyzer searches a predetermined range around the old peak location for a peak having an amplitude similar to that associated with the peak of interest in the previous sweep. The second algorithm differs from the first in that the range over which the search is conducted is larger and the search is performed from the outside of the search region inward rather than from the center outward. The purpose of this search algorithm is to find a signal that is drifting very rapidly before the signal of interest drifts off the screen. Signals that are about to drift off the screen will be quickly caught by this method. This algorithm tests each triplet $(f_{j-1}, A_{j-1})$, $(f_j, A_j)$, and $(f_{j+1}, A_{j+1})$ for $j=j-DJ_2$ to $j=j+DJ_2$ to determine if the triplet satisfies the peak condition. Here, $dJ_2$ is an integer defining the width of the search window. The triplets are tested in order based on their distance from the edge of the search region. That is, the triplet centered at j is tested, then the triplet at $J+DJ_2-1$, next the triplet at $J-DJ_2+1$, next the triplet at $J+DJ_2-2$, and so on. If a peak is found, the amplitude is compared to the previous amplitude for the marked peak. If $A - DA_2 \leq A_j \leq A + DA_2$, the peak is assumed to be the peak corresponding to the marked peak in the previous display, and the process is terminated. Here, $DA_2$ is a predetermined tolerance constant, which defines the maximum acceptable rate of change for the peak amplitude between frames. In general, $DA_1 \leq DA_2$, if the peak amplitude lies outside this range, the peak is rejected and the search continues. If no peak is found within the frequency range defined by $DJ_2$, the controller continues the search using the third search algorithm.

The third algorithm makes an exhaustive search for all peaks in the region of the spectrum displayed on the screen. The algorithm then computes a ranking for these peaks based on the extent to which the peaks match the location and amplitude of the peak of interest in the previous screen. The peak having the highest ranking is then selected to the peak that receives the marker in the next frame. The ranking function used in the preferred embodiment of the present invention generates a ranking value.

$E = |\Delta f| + |\Delta A| w$ where w is a predetermined weighting factor and $\Delta f$ and $\Delta A$ are the differences in frequency and amplitude, respectively, between the candidate peak in the current frame and the marked peak in the previous frame. The peaks are ranked in an order corresponding to 1/E. The value of the weighting factor, w, depends on the expected maximum rate of change for the frequency and amplitude. This factor is determined empirically. In one embodiment of the present invention, w=6 is utilized.

The above-described embodiments of the present invention have utilized a particular criterion to identify a peak in the amplitude versus frequency plot. However, it will be obvious to those skilled in the art from the preceding discussion that other peak identification criteria could be utilized. For example, a sequence of more than 3 points can be analyzed by fitting the points to a quadratic or higher polynomial to determine if the sequence of points forms a curve that is concave downward with a maximum within the sequence. While such criteria are more immune to noise, they are computationally more demanding, and hence, not preferred.

Various modifications to the present invention will become apparent to those skilled in the art from the foregoing description and accompanying drawings. Accordingly, the present invention is to be limited solely by the scope of the following claims.

What is claimed is:

1. A method for operating a spectrum analyzer to provide a marker that follows a peak from sweep to sweep in a spectrum display in which the amplitude of a signal is plotted against frequency, said method operating on a first measured spectrum comprising a plot of said signal amplitude against frequency during a first time interval in which said marker has been assigned a first frequency and first amplitude corresponding to said peak and a second spectrum comprising a plot of said signal amplitude against frequency during a subsequent time interval in which said marker is to be assigned a new frequency and a new amplitude, said method comprising the steps of:

defining a first frequency range in said second measured spectrum centered around said first frequency;

searching said first frequency range for a candidate peak having an amplitude within a first range centered on said first amplitude, and, if such a candidate peak is found, assigning said new frequency the frequency of said candidate peak in said second spectrum and said new amplitude to the amplitude of said candidate peak in said second spectrum, wherein if more than one such candidate peak is found by said search, the frequency and amplitude of said candidate peak closest to said first frequency are assigned as said new frequency and said new amplitude.

2. A method for operating a spectrum analyzer to provide a marker that follows a peak from sweep to sweep in a spectrum display in which the amplitude of a signal is plotted against frequency, said method operating on a first measured spectrum comprising a plot of said signal amplitude against frequency during a first time interval in which said marker has been assigned a first frequency and first amplitude corresponding to said peak and a second spectrum comprising a plot of said signal amplitude against frequency during a subsequent time interval in which said marker is to be assigned a new frequency and a new amplitude, said method comprising the steps of:

defining a first frequency range in said second measured spectrum centered around said first frequency;

searching said first frequency range for a candidate peak having an amplitude within a first range centered on said first amplitude, and, if such a candidate peak is found, assigning said new frequency the frequency of said candidate peak in said second spectrum and said new amplitude to the amplitude of said candidate peak in said second spectrum, wherein if more than one such candidate peak is found by said search, the frequency and amplitude of said candidate peak closest to said first frequency are assigned as said new frequency and said new amplitude, wherein said step of searching said first frequency range does not find a candidate peak and wherein said method further comprises the steps of:

defining a second frequency range in said second measured spectrum centered around said first frequency;

searching said second frequency range for a candidate peak having an amplitude within a second range centered on said first amplitude, and, if such a candidate peak is found, assigning said new frequency the frequency of said candidate peak in said second spectrum and said new amplitude to the amplitude of said candidate peak in said second spectrum, wherein if more than one such candidate peak is found by said search, the frequency and amplitude of said candidate peak farthest from said first frequency are assigned as said new frequency and said new amplitude.

3. The method of claim 2 wherein said step of searching said second frequency range does not find a candidate peak and wherein said method further comprises the steps of:

defining a third frequency range in said second measured spectrum centered around said first frequency;

searching said third frequency range for candidate peaks;

assigning an order value to said candidate peaks based on the differences in frequency and amplitude between each candidate peak and said first frequency and said first amplitude, respectively; and assigning said frequency and amplitude of said candidate peak having the highest order value as said new frequency and said new amplitude.

4. The method of claim 3 wherein said order value depends on a weighted sum of difference in said frequency and said difference in amplitude.

* * * * *